Figure 1:
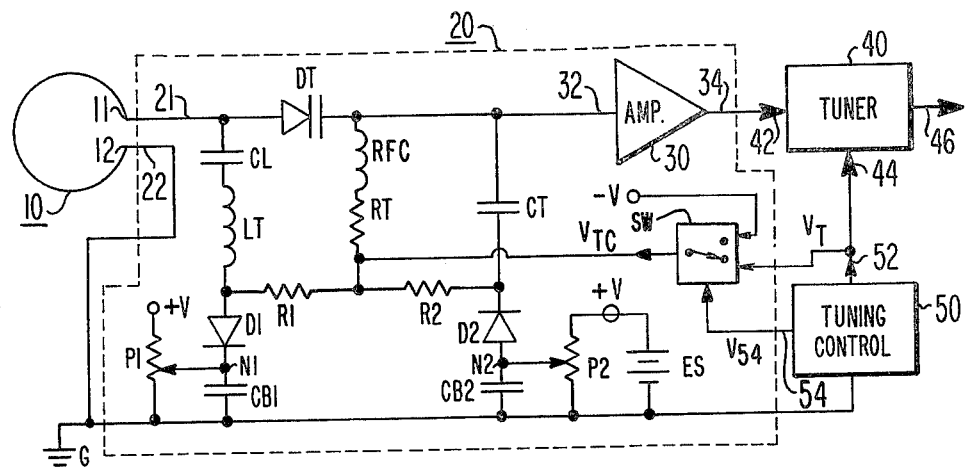

United States Patent [19]

Torres et al.

[11] 4,339,827
[45] Jul. 13, 1982

[54] AUTOMATIC TUNING CIRCUIT ARRANGEMENT WITH SWITCHED IMPEDANCES

[75] Inventors: Rafael Torres, Plainsboro; John G. N. Henderson, Princeton, both of N.J.

[73] Assignee: RCA Corporation, New York, N.Y.

[21] Appl. No.: 210,247

[22] Filed: Nov. 25, 1980

[51] Int. Cl.³ .............................................. H04B 1/18
[52] U.S. Cl. .................................... 455/188; 334/15; 343/748; 455/193; 455/289
[58] Field of Search .................... 334/3, 15; 358/191.1; 455/191, 193, 195, 280, 289, 291, 188, 286, 290; 343/702, 748

[56] References Cited

U.S. PATENT DOCUMENTS

| | | | |
|---|---|---|---|
| 2,301,324 | 11/1942 | Reid | 250/20 |
| 2,318,516 | 5/1943 | Newbold | 250/20 |
| 2,558,487 | 6/1951 | Hills | 250/33 |
| 3,492,514 | 1/1970 | Korn | 307/320 |
| 3,571,716 | 3/1971 | Hill et al. | 325/383 |
| 3,613,008 | 10/1971 | Jabbar | 455/289 X |
| 3,646,450 | 2/1972 | Ma | 325/458 |
| 3,794,924 | 2/1974 | Furuya et al. | 334/15 X |
| 3,852,670 | 12/1974 | Ma | 325/357 |
| 3,980,957 | 9/1976 | Putzer | 325/469 |
| 4,023,106 | 5/1977 | Utsunomiya | 334/15 X |
| 4,048,598 | 9/1977 | Knight | 334/15 |
| 4,153,887 | 5/1979 | Poppa | 333/172 |
| 4,186,350 | 1/1980 | Takayama | 325/383 |
| 4,216,451 | 8/1980 | Nishimura et al. | 334/15 |
| 4,247,953 | 1/1981 | Shinagawa et al. | 455/191 |
| 4,271,529 | 6/1981 | Strammello, Jr. | 455/180 |

OTHER PUBLICATIONS

Kane, Fukui & Okamoto, "Efficient Small–Size Antenna for FM Radio Reception", *IEEE Transactions on Consumer Electronics*, vol. CE-26, No. 3, Aug. 1980, pp. 251–262.

Magnavox Service Manual No. 7362B, "Microprocessor Touch–Tone Tuning System Familiarization & Circuit Operation", Mar. 1979.

*Primary Examiner*—Paul L. Gensler
*Attorney, Agent, or Firm*—Eugene M. Whitacre; Paul J. Rasmussen; Clement A. Berard, Jr.

[57] ABSTRACT

Tuning circuitry for a VHF television (TV) antenna tunes such antenna for signals corresponding to the TV channel selected and couples those signals to the tuning system of a television receiver. An antenna has a pair of signal terminals across which the tuning circuitry connects to form a resonance circuit therewith for tuning the antenna. A variable capacitance responds to a control voltage to develop the appropriate value of tuning capacitance. Impedances, e.g. inductors or capacitors or resistors, are coupled to the resonance circuit at least at selected times by switches. An amplifier couples signals from the resonance circuit to the tuning system of the TV receiver.

25 Claims, 2 Drawing Figures

… … …

AUTOMATIC TUNING CIRCUIT ARRANGEMENT WITH SWITCHED IMPEDANCES

This invention relates to tuning circuits and, in particular to tuning circuits having switched impedances for use with a television antenna.

Conventional television (TV) receivers receive television signals in a lower (54–88 MHz) and upper (174–216 MHz) very high frequency (VHF) television band. The lower band includes VHF channels 2-6 and the upper band includes VHF channels 7-13, higher channel numbers being associated with higher frequencies within each band. Tuning systems for such TV receivers include a tuner having a tuned radio frequency amplifier and a tuned local oscillator employed to translate the received TV signals from the VHF range to an intermediate frequency (IF) range to enable processing by further circuits of the TV receiver. Conventional tuners tend to exhibit input impedances which can vary considerably over the range of frequencies included within the VHF-TV frequency bands.

Where a small loop antenna is to be included within the cabinet of a television receiver, it is necessary that such antenna be tuned to the frequency of the particular channel which is selected to be received. It is impractical to use such antennas directly with standard tuning circuits in cooperation with a conventional tuner because the above mentioned variation of input impedance and the length of the transmission line (e.g. coaxial cable) between the antenna and the tuner render tuning to sufficient accuracy difficult to attain. Thus, there exists a need for a tuning circuit for use in cooperation with such small loop antennas so that tuning over the entire range of the lower and upper VHF-TV frequency bands may obtain. The present invention is directed to such tuning circuit arrangements.

In the present invention, a tuning circuit arrangement for a receiving antenna of a television receiver comprises first and second input signal terminals to which the antenna is coupled, and an output signal terminal for coupling the tuning circuitry to the tuning system of the TV receiver. A resonance circuit is coupled to the first and second input signal terminals for tuning the antenna over a range of frequencies responsive to a first control potential. The resonance circuit includes variable capacitance means which develops a variable capacitance responsive to the first control potential when it is a first polarity, and which develops a low impedance when that control potential is of a second and opposite polarity. The resonance circuit further includes an impedance means, and a switch for coupling the impedance means to the resonance circuit at least at selected times. The resonance circuit is coupled to the input connection of an amplifier, the output connection of which couples to the output signal terminal.

Figure 2:
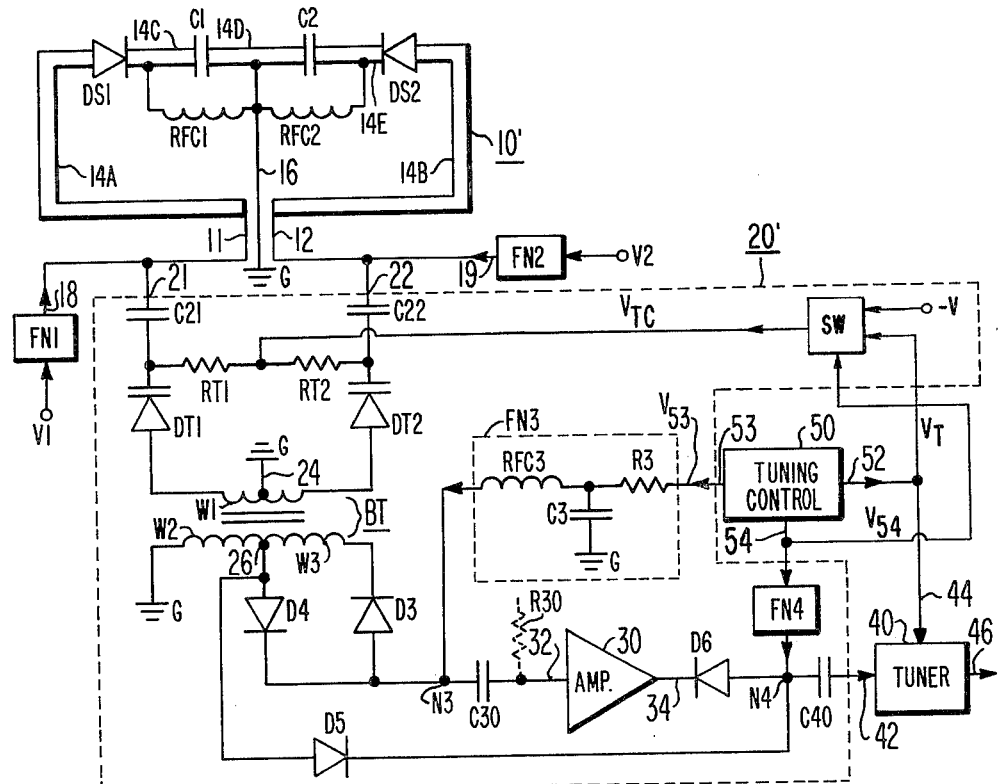

In the FIGURES:

FIGS. 1 and 2 show embodiments of tuning circuit arrangements according to the present invention.

In FIG. 1, tuning circuit 20 receives at its input signal leads 21 and 22 VHF-TV signals from feed terminals 11 and 12, respectively, of loop antenna 10. Loop antenna 10 and amplifier 30 may be of the sort described in U.S. patent application Ser. No. 210,251 filed by O. M. Woodward and J. G. N. Henderson on even date herewith and entitled LOOP ANTENNA ARRANGEMENTS FOR INCLUSION IN A TELEVISION RECEIVER, assigned to the same assignee as is the present invention, and which application is incorporated herein by reference. Antenna 10 can be a loop of conductive material with a gap therein to serve as feed terminals 11 and 12. Amplifier 30 is a common-emitter amplifier serving to isolate the impedance of tuner 40 from the tuning circuitry for antenna 10.

Input lead 21 couples to input connection 32 of amplifier 30 through variable capacitance diode DT. The capacitance of DT is responsive to the potential impressed between its anode and cathode electrodes. Output connection 34 of amplifier 30 is coupled to input 42 of tuner 40 within the tuning system of the TV receiver. It is noted that the main purpose of amplifier 30 is to isolate antenna 10 and its associated tuning circuit to be described below from the input impedance of tuner 40. Tuning control 50 within that tuning system supplies control potential $V_T$ at circuit point 52. Potential $V_T$ is applied to control input 44 of tuner 40 and is employed therein to effect tuning to the selected channel. Signals at the intermediate frequency are available at tuner output 46 from whence they are supplied to the processing circuitry of the TV receiver. See, for example, U.S. Pat. No. 4,031,549 entitled TELEVISION TUNING SYSTEM WITH PROVISIONS FOR RECEIVING RF CARRIER AT NON-STANDARD FREQUENCY issued to Rast, et al on June 21, 1977 which discloses a tuning system of the type described hereinabove with respect to tuner 40 and tuning control 50.

The anode of variable capacitance diode DT is returned to ground point G via a direct-coupled path through antenna 10. Tuning potential $V_T$ is developed by tuning control 50 responsive to the channel selection made by the user of the TV receiver. Switch SW develops control potential $V_{TC}$ from tuning potential $V_T$ and bias potential $-V$. When one of channels 2-6 is selected to be received, bandswitch signal $V_{54}$ is high (positive) and SW passes $V_T$ directly through to $V_{TC}$, i.e. both $V_T$ and $V_{TC}$ are at substantially the same potential. When one of channels 7-13 is selected, bandswitch signal $V_{54}$ is low (negative) switch SW disconnects $V_T$ from $V_{TC}$ and passes relatively negative bias potential $-V$ through to $V_{TC}$. Control potential $V_{TC}$ is applied to the cathode of DT via resistance RT and choke RFC. RT and RFC exhibit a.c. impedance of sufficiently high value that the TV signals passing through diode DT are directed primarily towards amplifier 30 but exhibit d.c. impedance of sufficiently low value to pass forward bias current responsive to control potential $V_{TC}$ to the cathode of DT.

The capacitance of DT is controlled for receiving signals corresponding to channels 2-6 in the lower VHF frequency band. $V_{TC}$ varies from approximately 1.5 volts at VHF channel 2 up to approximately 30 volts at VHF channel 6. $V_{TC}$ is a negative potential for VHF channels 7—13 so that capacitance diode DT is forward biased connecting lead 21 to input connection 32 via a low impedance as compared to the impedance of the capacitance exhibited by diode DT when it is reverse biased. The range of tuning afforded by diode DT alone is insufficient to tune small loop antenna 10 over the entire lower VHF TV band. So that tuning may be accomplished for VHF channels 2, 3 and 4, capacitance CT is selectively coupled between input connection 32 of amplifier 30 and input terminal 22 when the selected channel is 2, 3 or 4. So that tuning may be accomplished for VHF channels 5 and 6, inductance LT is selectively coupled between input terminals 21 and 22 when the selected channel is 5 or 6. Switching circuits for selectively coupling impedances CT and LT are now to be described.

Capacitor CT is switched by diode D2 which receives a substantially fixed potential at its anode from node N2. That potential is developed from a source of positive potential +V represented schematically by battery ES by a voltage divider, shown by way of example as potentiometer P2. A variable control potential having a magnitude related to the selected channel is applied to the cathode of D2. As shown, that potential is responsive to control potential $V_{TC}$ coupled to the cathode of D2 through resistance R2. Capacitor CB2 is of large value as compared to CT and completes a low a.c. impedance connection between input lead 22 and capacitor CT through diode D2 at VHF frequencies. The potential at N2 is of a value selected to be between the values of control potential $V_{TC}$ corresponding to VHF channels 4 and 5. It was found convenient to so select the switching between channels 4 and 5 because the potential of N2 need not be maintained with high accuracy owing to the somewhat greater difference between the carrier frequencies of those VHF channels (i.e. a 10 MHz difference between channels 4 and 5). Thus, diode D2 is forward biased when VHF channels 2, 3 or 4 are selected and is reverse biased when VHF channels 5 and 6 are selected.

In similar fashion, diode D1 receives a fixed potential from source +V and potentiometer P1 at its cathode which connects to node N1. D1 receives a variable control potential having a magnitude related to the selected channel as its anode. As shown that control potential is responsive to control potential $V_{TC}$ coupled to the anode of D1 through resistor R1. Blocking capacitors CL and CB1 are of high relative value to exhibit substantially low a.c. impedance at VHF frequencies as compared to that of LT. CL and CB1 serve to complete an a.c. connection between input leads 21 and 22 through LT and D1, and to DC isolate input leads 21 and 22 from the anode and cathode of D1, respectively, so that direct control potentials may be applied thereacross.

In an embodiment of tuning circuit 20 of FIG. 1 constructed by the present inventors, the following components were employed:

TABLE I

| Component | Value |
| --- | --- |
| CL | 0.01 uF |
| CT | 43 pF |
| CB1, CB2 | 0.001 uF |
| LT | 0.6 uH |
| RFC | 10 uH |
| R1 | 3KΩ |
| R2 | 1.2kΩ |
| RT, P1, P2 | 2kΩ |
| DT (varactor diode) | BB-105 (Siemens) |
| D1, D2 | HP 5082-3188 PIN diodes (Hewlett-Packard). |
| Antenna 10 | E.g., 18-inch diameter loop of 2-inch wide copper strip. |

It is noted that switching diodes D1 and D2 are PIN diodes which desirably exhibit very high impedance when reverse biased and exhibit very low impedance when forward biased. It is further noted that diodes D1 and D2 are rendered conductive and non-conductive directly responsive to the tuning control potential $V_{TC}$ in the above-described embodiment.

Since a small loop antenna exhibits a direction sensitive reception response pattern, it has been found desirable to provide apparatus for rendering the reception pattern of such an antenna steerable. In FIG. 2, tuning circuit 20' cooperates with a steerable loop antenna 10'. Loop antenna 10' is broken into a plurality of sections 14A, 14B, 14C, 14D, and 14E by a plurality of gaps. A first gap defines antenna feed terminals 11 and 12. A pair of further gaps are bridged by capacitors C1 and C2, the location and value of which are selected to provide a more uniform current distribution with loop antenna 10' to improve the uniformity of its radiation reception pattern across the lower VHF frequency band, and particularly at VHF channel 2. A further pair of gaps is bridged by PIN switching diodes DS1 and DS2 which are rendered conductive and nonconductive so the antenna reception pattern can be steered when signals corresponding to VHF channels 7–13 are selected to be received. Inductors RFC1 and RFC2 provide direct current paths across capacitors C1 and C2, respectively, so that a reference potential from ground G via conductor 16 is conducted to the respective cathodes of DS1 and DS2. Steerable antenna 10' is described in detail in U.S. patent application Ser. No. 210,249 entitled IMPROVED LOOP ANTENNA ARRANGEMENT FOR INCLUSION IN A TELEVISION RECEIVER filed by R. Torres and O. M. Woodward on even date herewith, and assigned to the same assignee as is the present invention, and which is incorporated herein by reference.

Steering control potentials $V_1$ and $V_2$ are applied to the anodes of DS1 and DS2, respectively, via filter networks FN1 and FN2, respectively. The cathodes of DS1 and DS2 connect to ground point G via conductor 16 and inductors RFC1 and RFC2, respectively. Positive potentials at output connections 18 and 19 of FN1 and FN2, respectively, serve to forward bias diodes DS1 and DS2 respectively. Conversely, negative potentials at 18 and 19 reverse bias diodes DS1 and DS2. Filter networks FN1 and FN2 are of sufficiently low impedance to pass switching potentials $V_1$ and $V_2$ to output connections 18 and 19. Their impedances are sufficiently high as compared to the impedances at input signal terminals 21 and 22 at VHF frequencies so that VHF-TV signals are directed towards terminals 21 and 22. Filter networks FN1 and FN2 can employ circuitry of the same type as that shown for FN3 described below. Means for developing potentials $V_1$ and $V_2$ and apparatus for steering antenna 10' are described in U.S. patent application Ser. No. 210,248 entitled APPARATUS FOR AUTOMATICALLY STEERING AN ELECTRICALLY STEERABLE TELEVISION ANTENNA filed by J. G. N. Henderson on even date herewith and assigned to the same assignee as is the present invention, and which application is incorporated herein by reference.

Antenna 10' couples to the series connection of variable capacitance tuning diodes DT1 and DT2, blocking capacitors C21 and C22, and winding W1 of transformer BT of tuning circuit 20' forming a resonance circuit. The anodes of DT1 and DT2 receive reference potential from ground G via winding W1 and its center tap 24. They receive control potential $V_{TC}$ via resistances RT1 and RT2 connected to their respective cathodes. DT1 and DT2 are reverse biased by $V_{TC}$ of value between +1 and +30 volts when VHF channels 2–6 are selected to be received, and receive a negative potential so as to be forward biased when VHF channels 7–13 are selected to be received. Control potential $V_{TC}$ is developed from tuning voltage $V_T$, bandswitch signal $V_{54}$, and bias potential $-V$ by switch SW as described above in relation to FIG. 1. DC Blocking capacitors C21 and C22 isolate the respective cathodes of DT1 and DT2 from feed terminals 11 and 12 of antenna 10' so that tuning voltage $V_{TC}$ does not disturb control potentials $V_1$ and $V_2$ applied to DS1 and DS2, respectively. C21 and C22 also serve to prevent those control potentials from affecting the tuning potentials at the respective cathodes of DT1 and DT2. Resistors RT1 and RT2 are of sufficiently high value so that VHF-TV signals passing through C21–DT1 and C22–DT2 are not diverted to tuning control 50, but are substantially applied to winding W1.

Balanced-to-unbalanced (balun) transformer BT converts a balanced signal applied to its primary winding W1 into single-ended signals across its secondary windings W2 and W3 which are referenced to ground potential at G. BT exhibits a turns ratio between its primary winding W1 and its respective secondary windings W2 and W3, which secondary windings are shown as being serially connected at node 26. Switching diodes D3 and D4 serve to switch the effective turns ratio of transformer BT. Diode D3 is poled to receive reference potential at its cathode via windings W2 and W3 and to receive a control potential from node N3 at its anode. Diode D4 is oppositely poled with respect to D3 so as to receive ground potential at its anode via winding W2 and control potential from node N3 at its cathode. When the potential at N3 is positive, D3 is conductive and D4 is nonconductive. As a result, the signals coupled via capacitor C30 to amplifier 30 are substantially proportional to the sum of the signals generated by windings W2 and W3 and the effective turns ratio of BT is determined by W1 and the sum of the turns of W2 and W3. On the other hand, when the potential at N3 is negative, D4 is conductive and D3 is nonconductive. In this condition, the signals applied to input connection 32 are substantially proportional to those developed by winding W2 alone and the effective turns ratio of BT is determined by W1 and W2.

Control potential at N3 is developed by tuning control 50 and has a magnitude corresponding to the VHF-TV channel selected to be received. The potential at node 53, indicated by $V_{53}$, is a band switching potential applied to node N3 from tuning control 50 via filter network FN3. It is understood that the negative level of $V_{53}$ is generated in like manner to that employed in switch SW to develop negative levels of $V_{TC}$. Resistor R3 serves to limit the forward bias current flowing in D3 or D4 to a predetermined value. Capacitor C3 provides a low impedance bypass for signals at VHF frequencies. Inductor RFC 3 exhibits a high impedance at VHF frequencies so that VHF-TV signals at N3 are substantially directed to input 32 of amplifier 30.

Resistance R30, shown in phantom, represents the equivalent impedance at input connection 32 which includes the input impedance of amplifier 30. That impedance is coupled to the resonance circuit including DT1 and DT2 via transformer BT and the switching of diodes D3 and D4. As a result of the switching of the effective turns ratio of transformer BT by diodes D3 and D4, the effective value of impedance coupled to the resonance circuit is switched responsive to $V_{53}$ which is related to the VHF channel selected to be received. When diode D3 is conductive, the transformed impedance reflected at the primary winding W1 is proportional to the resistance R30 as modified by the square of the turns ratio $(W_1)/(W_2+W_{30})$, which is, e.g., 1:2.

When diode D4 is conductive, the impedance reflected at winding W1 is proportional to resistance R30 as modified by the square of the turns ratio $W_1/W_2$, which may be, e.g., 1:1. The present inventors have determined that it is desirable to have a higher impedance reflected when channel 2, 3 or 4 is selected than when channel 5 or 6 is selected. Accordingly, it is preferable for D3 to be conductive when VHF channel 2, 3 or 4 is selected and for D4 to be conductive when VHF channel 5 or 6 is selected.

Tuning diodes DT1 and DT2 cooperate in a beneficial manner with switched-turns-ratio transformer BT to overcome a practical problem. When signals are taken from the series-connected windings W2 and W3, BT can exhibit a resonance condition with antenna 10' at a frequency near that of VHF channel 5. That resonance could interfere with the tuning of antenna 10' for channels 5 and 6 were DT1 and DT2 to be coupled in circuit with secondaries W2 and W3. That resonance is in part a consequence of the winding inductance and capacitance of BT coupling to the reactive impedance characteristic of antenna 10'. Having DT1 and DT2 coupled in circuit with primary windings W1 enables BT to be more conveniently switched so that only W2 supplies signals when channels 5 or 6 are selected. Switching the turns ratio of BT results in raising the resonance frequency to a substantially higher frequency so that tuning at channels 5 and 6 is readily obtained. That transformer switching further causes the transformed impedance coupled to the tuning resonance circuit, for example, from R30, to be increased for channels 5 and 6 so as to maintain a closer impedance match over the entire range of frequencies than would otherwise obtain. Stated in other words, the transformed impedance of antenna 10' can be considered to be decreased for channels 5 and 6 so as to maintain closer impedance matching. For those reasons, it is desirable that DT1 and DT2 be coupled in circuit with primary winding W1 of transformer BT.

When VHF channels 7–13 in the upper portion of the VHF-TV frequency bands are selected to be received, the potential $V_{N4}$ at node N4 is of negative polarity. It is understood that the negative level at node N4 is developed in like manner to that employed to develop the negative level of $V_{TC}$ described above. $V_{N4}$ is responsive to potential $V_{54}$ supplied from output 54 of tuning control 50 via filter network FN4, of like type to FN3. Diode D5 receives ground G potential at its anode via winding W2 and is thus forward biased when the potential $V_{N4}$ at N4 is negative. Potential $V_{N4}$ is either higher or lower than the potential at output connection 34 which varies over a predetermined range of potentials. Thus when $V_{N4}$ is negative, diode D6 is reverse biased.

When VHF channels 2–6 are selected to be received, potential $V_{54}$ is positive rendering D5 nonconductive and D6 conductive so that output connection 34 of amplifier 30 is coupled to input 42 of tuner 40. On the other hand, when channels 7–13 are selected, D5 is forward biased and D6 is reverse biased and output 34 of amplifier 30 is disconnected from N4 by D6. Thus, signals are applied to input 42 of tuner 40 directly from winding W2 via connection 26 and diode D5.

Disconnecting amplifier 30 as just described avoids a practical problem that would occur if the TV receiver were used where strong signals, other than those desired to be received, are present. FM radio signals, for example, are broadcast in the 88–108 MHz frequency band, the second harmonic of which falls with the frequency band of VHF-TV channels 7-13 (174-216 MHz). If amplifier 30 were connected, such second harmonic signals could be generated by nonlinearities associated with an amplifying transistor in amplifier 30. Those second harmonic signals as well as other undesired signals could mix with the desired VHF-TV signals, and undesirable cross-modulation and other interfering signals would be developed. Such interfering signals are not removed by tuner 40 and undesirably degrade the quality of the displayed TV picture. In the upper portion of the VHF-TV frequency band, however, the mismatch between the input impedance of tuner 40 and the impedance of antenna 10' (as modified by transformer BT) can be less severe. In that instance, the impedance match can be satisfactory so that the impedance isolation provided by amplifier 30 can be dispensed with. In the lower portion of the VHF-TV frequency band, the cross-modulation problem can be less severe because antenna 10' is tuned so as to be more frequency selective. Control voltages $V_{53}$, $V_{54}$ and $V_T$ corresponding to selected VHF channels are given below in Table II by way of example.

TABLE II

| VHF Channel No | $V_{53}$ | $V_{54}$ | $V_T$ |
|---|---|---|---|
| 2 | 18. | 18. | 1.7 |
| 3 | 18. | 18. | 5.5 |
| 4 | 18. | 18. | 8.7 |
| 5 | −18. | 18. | 17. |
| 6 | −18. | 18. | 30. |
| 7-13 | −18. | −18. | −18. |
| (all in volts, approximately) | | | |

Rast, U.S. Pat. No. 4,031,549 referred to previously, describes means by which a tuning voltage, such as $V_T$ herein, is developed for control of a varactor tuning circuit. The Rast patent also describes means by which bandswitching signals, such as $V_{53}$ and $V_{54}$ herein, are generated. Amplifier 30 can be of like type to that described in U.S. patent application Ser. No. 210,251 of Woodward et al referred to above. Values of components employed in an exemplary embodiment of tuning circuit 20' constructed in accordance with the present invention are given in Table III below.

TABLE III

| Component | Value |
|---|---|
| C1, C2 | 6.8 pF |
| C3 | 1 uF |
| C21, C22, C30, C40 | 0.1 uF |
| RFC 1, RFC2, RFC3 | 10 uH |
| R3 | 2 kΩ |
| R30 | 75Ω(equivalent) |
| RT1, RT2 | 100 kΩ |
| BT: W1 | 3 turns, center-tapped |
| W2, W3 | 3 turns each |
| DT1, DT2 (varactor diode) | (2) BB-709B each (Siemens) |
| D3, D4, D5, D6, DS1, DS2 | HP 5082-3188 PIN diodes (Hewlett Packard) |
| Antenna 10' | 14 × 25-inch rectangular loop (of 2-inch wide copper strip on three sides and of one-half-inch strip in a fourth side). |

Modifications of the specific embodiments discussed with reference to FIGS. 1 and 2 herein are contemplated to be within the scope of the present invention as defined by the following claims. For example, the manner in which variable capacitance diodes DT, DT1 and DT2 and the PIN switch diodes D1, D2, D3, D4 and D5 are connected may be reversed with corresponding reversal of the polarity of their respective control potentials. Further, for example, windings W2 and W3 can be of differing number of turns connected in parallel with one end of each winding connected to ground G and its respective other end connected to D4 and D3, respectively. By way of still further example, capacitance diode DT1 may comprise a plurality of such diodes in parallel connection as is advantageous where the range of capacitance required for tuning exceeds that available from a single such diode. It is also satisfactory that a balanced transformer such as BT be interposed in the tuning circuit of FIG. 1 between input terminals 21 and 22 and the remainder of tuning circuit 20.

What is claimed is:

1. A tuning circuit arrangement for a receiving loop antenna of a receiver having a tuning system comprising:

first and second input signal terminals to which said loop antenna is coupled and an output signal terminal for coupling said tuning circuit arrangement to said tuning system;

resonance circuit means coupled to said first and second input signal terminals for tuning said loop antenna over a range of frequencies responsive to a first control potential, which first control potential is of first polarity at selected times and which is of second polarity opposite to the first polarity at times other than said selected times, including variable capacitance means for developing a variable capacitance responsive to said first control potential at said selected times when said first control potential is of said first polarity, and for developing a low impedance compared to that of its variable capacitance at said times when said first control potential is of said second polarity, said variable capacitance means being coupled in circuit with said first and second input signal terminals, at least one other impedance means for exhibiting an impedance, and switch means for coupling said other impedance means to said resonance circuit means at least at selected times; and amplifying means having an input connection to which said resonance circuit means is coupled, and having an output connection coupled to said output signal terminal.

2. In the arrangement of claim 1 wherein said loop antenna receives television signals over a range of frequencies, which range has lower and upper portions, each of said lower and upper portions including a plurality of channels, means for generating said first control potential of said first polarity when signals in the lower portion of said range are selected to be received, and for generating said first control potential of said second polarity when signals in the upper portion thereof are selected to be received.

3. The arrangement of claim 2 including means for determining the selected times at which said switch means is rendered conductive and nonconductive, said determining means rendering said switch means conductive when signals associated with predetermined channels in said lower portion are selected to be received, and rendering said switch means nonconductive when signals associated with channels in said lower portion other than said predetermined channels are selected to be received.

4. The arrangement of claim 1 wherein said switch means comprises:
- diode means having anode and cathode electrodes, one of which electrodes is coupled to said impedance means;
- means for applying a substantially constant potential to one of said anode and cathode electrodes; and
- means for applying a second control potential selectively having first and second predetermined magnitude ranges to the other of said anode and cathode electrodes, which second control potential is of said first predetermined magnitude range to make the anode electrode of relatively positive polarity with respect to the cathode electrode for rendering said diode means conductive, and is of said second predetermined magnitude range to make the anode electrode of relatively negative polarity with respect to the cathode electrode for rendering said diode means nonconductive.

5. In the arrangement of claim 4 wherein said loop antenna receives television signals over a range of frequencies, which frequency range has lower and upper portions, each of said lower and upper portions including a plurality of channels,
- means for generating said second control potential of said first predetermined magnitude range when signals associated with predetermined channels in said lower portion are selected to be received, and for generating said second control potential of said second predetermined magnitude range when signals associated with channels in said lower portion other than said predetermined channels are selected to be received.

6. The arrangement of claim 4 wherein said variable capacitance means is coupled between said first input signal terminal and the input connection of said amplifying means, and
- said other impedance means and said diode means are serially coupled between said first and second input signal terminals.

7. The arrangement of claim 6 wherein said other impedance means includes an inductance, an end of which connects to one of the anode and cathode electrodes of said diode.

8. The arrangement of claim 4 wherein said variable capacitance means is coupled between said first input signal terminal and the input connection of said amplifying means, and
- said other impedance means and said diode means are serially coupled between the input connection of said amplifying means and said second input signal terminal.

9. The arrangement of claim 8 wherein said other impedance means includes a capacitance, an end of which connects to one of the anode and cathode electrodes of said diode means.

10. The arrangement of claim 4, 5, 6, 7, 8 or 9 wherein said second control potential is responsive to said first control potential.

11. A tuning circuit arrangement for a receiving loop antenna of a receiver having a tuning system comprising:
- first and second input signal terminals to which said loop antenna is coupled and an output signal terminal for coupling said tuning circuit arrangement to said tuning system;
- resonance circuit means coupled to said first and second input signal terminals for tuning said loop antenna over a range of frequencies responsive to a first control potential including
- variable capacitance means for developing a variable capacitance responsive to said first control potential when said first control potential is of first polarity, and for developing a low impedance compared to that of its variable capacitance when said first control potential is of second polarity opposite to the first, said variable capacitance means being coupled in circuit with said first and second input signal terminals,
- at least one other impedance means for exhibiting an impedance,
- impedance transformation means having first and second output circuits for exhibiting first and second transformation ratios, respectively, with respect to an input circuit thereof, and
- switch means for coupling said other impedance means to said first and second output circuits at least at selected times responsive to a second control potential; and
- amplifying means having an input connection to which said resonance circuit means is coupled, and having an output connection coupled to said output signal terminal.

12. The arrangement of claim 11 wherein said impedance transformation means includes:
- transformer means having a first winding for serving as the input circuit of said transformation means, and having second and third windings for respectively serving as the first and second output circuits thereof, each of which second and third windings exhibiting a predetermined transformer turns ratio with respect to the first winding; and wherein said switch means includes:
- first diode means for coupling said second winding to said other impedance means at a node, which first diode means is poled for conduction in a first direction sense with respect to said node;
- second diode means for coupling said third winding to said other impedance means at said node, which second diode means is poled in a second direction sense opposite to the first; and
- means for applying said second control potential to said node, which second control potential is selectively of first and second respective levels for rendering a respective one of said first and second diode means conductive, and the other one thereof nonconductive, respectively.

13. The arrangement of claim 12 wherein said variable capacitance means is coupled serially with said first winding between said first and second input signal terminals.

14. The arrangement of claim 13 wherein said first winding has first and second ends and a center tap connection therebetween, and
- said variable capacitance means includes first and second variable capacitance diodes each having respective anode and cathode electrodes, said first variable capacitance diode being coupled between said first input signal terminal and the first end of said first winding, said second variable capacitance diode being coupled between said second input signal terminal and the second end of said first winding; each of said first and second variable capacitance diodes being poled so that like ones of their respective anode and cathode electrodes are proximate the respective ends of said first winding; and said first control potential is applied between the center tap connection of said first winding and other like ones of the respective anode and cathode electrodes of said first and second variable capacitance diodes remote from the respective ends of said first winding.

15. The arrangement of claim 12 further including further switch means for coupling said second winding to the output connection of said amplifying means at further selected times responsive to a third control signal.

16. In the arrangement of claim 15 wherein said loop antenna receives television signals over a range of frequencies, which range has lower and upper portions, each of said lower and upper portions including a plurality of channels, means for generating said first control potential of said first polarity when signals in the lower portion of said range are selected to be received, and for generating said first control potential of said second polarity when signals in the upper portion thereof are selected to be received;

means for determining the selected times at which said first diode means is conductive to render said first diode means conductive when signals associated with predetermined channels in said lower portion are selected to be received;

means for determining the selected times at which said second diode means is conductive to render said second diode means conductive when signals associated with channels other than said predetermined channels are selected to be received; and means for determining the further selected times at which said further switch means is conductive to render said further switch means conductive when signals associated with channels in the upper portion of said range are selected to be received.

17. A tuning circuit arrangement for a VHF frequency-band loop antenna of a television receiver having a tuning system comprising:

a loop antenna having first and second signal terminals;

amplifying means having an input connection, and having an output connection for coupling to said tuning system;

variable capacitance means for developing a variable capacitance responsive to a first control potential when said first control potential is of first polarity, and for developing a low impedance compared to that of its variable capacitance when said first control potential is of second polarity opposite to the first, said variable capacitance means being coupled between said first signal terminal and the input connection of said amplifying means;

an inductance;

first switch means for selectively coupling said inductance between said first and second signal terminals responsive to said tuning system;

a capacitance; and second switch means for selectively coupling said capacitance between the input connection of said amplifying means and said second signal terminal responsive to said tuning system.

18. The arrangement of claim 17 wherein each of said switch means includes respective diode means having one of its respective anode and cathode electrodes connected to receive a respective substantially constant potential, and having the other of its respective anode and cathode electrodes connected to receive a respective potential responsive to said first control potential.

19. In the arrangement of claim 17 or 18 wherein the VHF frequency band has a plurality of channels in a lower frequency band thereof, and a plurality of channels in an upper frequency band thereof, means for rendering said first switch means conductive when signals in a first predetermined group of channels in said lower frequency band are selected to be received, and means for rendering said second switch means conductive when signals in a second predetermined group of channels different from the first group and in said lower frequency band are selected to be received.

20. The arrangement of claim 18 including means for developing said first control potential of said first polarity when signals in said lower frequency band are selected to be received, and for developing said first control potential of said second polarity when signals in said upper frequency band are selected to be received.

21. A tuning circuit arrangement for a VHF frequency band loop antenna of a television receiver having a tuning system comprising:

a loop antenna having first and second signal terminals;

amplifying means having an input connection, and having an output connection for coupling to said tuning system;

a transformer having first, second and third windings;

variable capacitance means for developing a variable capacitance responsive to a first control potential when said first control potential is of first polarity, and for developing a low impedance compared to that of its variable capacitance when said first control potential is of second polarity opposite to the first, said variable capacitance means being coupled serially with said first winding between said first and second signal terminals;

first diode means for coupling said second winding to the input connection of said amplifying means, which first diode means is poled for conduction in a first direction sense with respect to said input connection;

second diode means for coupling said third winding to the input connection of said amplifying means, which second diode means is poled in a second direction sense opposite to the first; and means for applying a second control potential to said input connection, which second control potential is of first and second respective values at selected times for rendering a respective one of said first and second diode means conductive, and the other one thereof nonconductive, respectively.

22. In the arrangement of claim 21 wherein the VHF frequency band has a plurality of channels in a lower frequency band thereof, and a plurality of channels in an upper frequency band thereof, means for rendering said first diode means conductive when signals in a first predetermined group of channels in said lower frequency band are selected to be received, and means for rendering said second diode means conductive when signals in a second predetermined group of channels different from the first group and in said lower frequency band are selected to be received.

23. The arrangement of claim 21 further including means for developing said first control potential of said first polarity when signals in said lower frequency band are selected to be received, and for developing said first control potential of said second polarity when signals in said upper frequency band are selected to be received.

24. The arrangement of claim 21 further including
further switch means for coupling said second winding to the output connection of said amplifying means at further selected times responsive to a third control signal.

25. In the arrangement of claim 24 wherein said loop antenna receives television signals over a range of frequencies, which range has lower and upper portions, each of said lower and upper portions including a plurality of channels,
means for developing said first control potential of said first polarity when signals in the lower portion of said range are selected to be received, and for developing said first control potential of said second polarity when signals in the upper portion thereof are selected to be received;
means for determining the selected times at which said first diode means is conductive to render said first diode means conductive when signals associated with predetermined channels in said lower portion are selected to be received;
means for determining the selected times at which said second diode means is conductive to render said second diode means conductive when signals associated with channels other than said predetermined channels are selected to be received; and
means for determining the further selected times at which said further switch means is conductive to render said further switch means conductive when signals associated with channels in the upper portion of said range are selected to be received.

* * * * *